United States Patent
Huang et al.

(10) Patent No.: US 11,925,002 B2
(45) Date of Patent: Mar. 5, 2024

(54) CASING STRUCTURE WITH FUNCTIONALITY OF EFFECTIVE THERMAL MANAGEMENT

(71) Applicant: AMLI MATERIALS TECHNOLOGY CO., LTD., Taoyuan (TW)

(72) Inventors: Jian-Jia Huang, New Taipei (TW); Chun-Kai Lin, Hsinchu County (TW); Chih-Ching Chen, Taoyuan (TW)

(73) Assignee: AMLI MATERIALS TECHNOLOGY CO., LTD., Taoyuan (TW)

( * ) Notice: Subject to any disclaimer, the term of this patent is extended or adjusted under 35 U.S.C. 154(b) by 212 days.

(21) Appl. No.: 17/176,283

(22) Filed: Feb. 16, 2021

(65) Prior Publication Data
US 2022/0183186 A1    Jun. 9, 2022

(30) Foreign Application Priority Data
Dec. 9, 2020 (TW) ................................ 109143347

(51) Int. Cl.
*H05K 7/20* (2006.01)
*G06F 1/20* (2006.01)

(52) U.S. Cl.
CPC ......... *H05K 7/20445* (2013.01); *G06F 1/203* (2013.01); *H05K 7/20509* (2013.01)

(58) Field of Classification Search
CPC . H05K 7/20445; H05K 7/20509; G06F 1/203
See application file for complete search history.

(56) References Cited

U.S. PATENT DOCUMENTS

| | | | |
|---|---|---|---|
| 6,317,314 B1 * | 11/2001 | Kung | G06F 1/1637 361/679.28 |
| 8,208,259 B1 * | 6/2012 | Wolfe | G06F 1/203 361/679.52 |

(Continued)

FOREIGN PATENT DOCUMENTS

| | | |
|---|---|---|
| CN | 205284011 U | 6/2016 |
| JP | H11-95871 | 4/1999 |

(Continued)

OTHER PUBLICATIONS

Search Report for Taiwan counterpart application TW109143347, dated Jun. 17, 2021.

(Continued)

*Primary Examiner* — Michael A Matey
(74) *Attorney, Agent, or Firm* — ANOVA LAW GROUP, PLLC

(57) ABSTRACT

A casing structure with functionality of effective thermal management is disclosed, which consists of a casing member, a low thermal conductivity medium, a second heat spreader, and a first heat spreader. When a user operates the electronic device, heat generated from CPU and/or GPU is transferred to the second heat spreader via the first heat spreader, and then is two-dimensionally spread in the second heat spreader. Consequently, the heat is dissipated away from the casing member to air due to the outstanding thermal radiation ability of the casing member. The low thermal conductivity medium is adopted for controlling a heat transfer of heat transferring paths from the heat source and ends to the casing member. By applying the casing structure in an electronic device by a form of a top casing and/or a back casing, an outer surface temperature of the casing member can be well controlled.

3 Claims, 16 Drawing Sheets

(56) References Cited

U.S. PATENT DOCUMENTS

| | | | |
|---|---|---|---|
| 9,430,006 B1* | 8/2016 | Hayashida | G06F 1/203 |
| 2006/0215368 A1* | 9/2006 | Tsai | H01L 23/433 |
| | | | 257/E23.09 |
| 2011/0309728 A1* | 12/2011 | Diebel | H05K 5/02 |
| | | | 312/293.1 |
| 2013/0047435 A1* | 2/2013 | Ofoma | H01L 23/34 |
| | | | 29/890.03 |
| 2013/0141866 A1* | 6/2013 | Refai-Ahmed | H01L 23/3672 |
| | | | 361/679.54 |
| 2015/0268704 A1* | 9/2015 | Chiriac | F28F 21/00 |
| | | | 165/185 |
| 2016/0289858 A1* | 10/2016 | Curran | C25D 11/08 |
| 2017/0034900 A1* | 2/2017 | Strader | H01L 23/36 |
| 2017/0131751 A1* | 5/2017 | Nguyen | C09K 5/063 |

FOREIGN PATENT DOCUMENTS

| | | |
|---|---|---|
| JP | 2003-86979 | 3/2003 |
| JP | 2005-159313 | 6/2005 |
| JP | 2015-216184 | 12/2015 |
| TW | M519269 U | 3/2016 |
| TW | I598016 B | 9/2017 |

OTHER PUBLICATIONS (English translation) Search Report for Taiwan counterpart application TW109143347, dated Jun. 17, 2021.
Examination Report for Japan counterpart application JP2021-094291, dated Jul. 19, 2022.
(English translation) Examination Report for Japan counterpart application JP2021-094291, dated Jul. 19, 2022.

* cited by examiner

CASING STRUCTURE WITH FUNCTIONALITY OF EFFECTIVE THERMAL MANAGEMENT

BACKGROUND OF THE INVENTION

1. Field of the Invention

The present invention relates to the technology field of thermal management for electronic device, and more particularly to a casing structure with functionality of effective thermal management.

2. Description of the Prior Art

Nowadays, portable electronic products have become necessary electronic devices for people in daily life and work, including laptop computer, tablet computer, smart phone, and wearable electronic device. FIG. 1 depicts a stereo diagram of a laptop computer, and FIG. 2 illustrates an exploded diagram of a portion of constituting elements of the laptop computer. The conventional laptop computer 1' is known comprising a first casing of a display device and a second casing of a host device. In which, the first casing consists of a rear cover 1A' and a front panel 1B', and the second casing consists of a base cover 1D' and a top cover 1C'. It is worth mentioning that, forgoing rear cover 1A', front panel 1B', top cover 1C', and base cover 1D' are industrially called A cover, B cover, C cover, and D cover, respectively.

From FIG. 1 and FIG. 2, it is found that a lithium battery 11' and a main board 10' provided with a CPU 101' and a GPU 102' are disposed in an accommodation space 1C1' of the top cover 1C'. Engineers skilled in development and manufacture of the laptop computer 1' certainly know that, the lithium battery 11', the CPU 101' and the GPU 102' are the principal heat source in the laptop computer 1'. For achieving a heat dissipation of the heat source, there are two radiating fans 12' disposed on the CPU 101' and the GPU 102', respectively. Moreover, the accommodation space 1C1' of the top cover 1C' is provided with at least one radiating mechanism thereon, such as heat pipe and/or heat sink. The conventionally-used thermal solution mentioned above is adopted for transferring the heat generated by the heat source to the base cover 1D', thereby radiating the heat to air through the base cover 1D'. On the other hand, letting the base cover 1D' be provided with a plurality of air vents 1D1' thereon is found to be helpful in exhausting heat flow into air by using the radiating fans 12'.

It needs to further explain that, an operating temperature of the CPU 101' or the GUP 102' is commonly greater than 70° C. Therefore, in case of a user putting the laptop computer 1' on his thighs and then operating it, the CPU 101' and the GPU 102' working in high operating load would generate high temperature so as to cause the base cover 1D' has a high surface temperature. As a result, it is inevitable that the user's thighs would be scalded by the base cover 1D'. In view of that, U.S. Pat. No. 8,526,179 discloses a laptop computer having thermal isolation design. Please refer to FIG. 1 and FIG. 2 again. According to the disclosures of U.S. Pat. No. 8,526,179, an thermal isolation plate is disposed on an outer surface of the base cover 1D', so as to form a thermal isolation between the base cover 1D' and the user's thighs. As such, in case of the user putting the laptop computer 1' on his thighs and then operating it, although the CPU 101' and the GPU 102' working in high operating load generate high temperature to cause the base cover 1D' has a high surface temperature, the user's thighs is protected by the thermal isolation plate from being scalded the outer surface of the base cover 1D'.

However, it is a pity that, the thermal isolation plate is also forms a thermal isolation between the base cover 1D' and air, thereby not only leading the heat dissipation efficiency of the conventionally-used thermal solution to be largely reduced, but also causing the heat flow blew out by the radiating fans 12' fail to be exhausted via the air vents 1D1' of the base cover 1D'.

From above descriptions, it is understood that there is still room for improvement in the conventional thermal solutions. In view of that, inventors of the present application have made great efforts to make inventive research and eventually provided a casing structure with functionality of effective thermal management.

SUMMARY OF THE INVENTION

The primary objective of the present invention is to disclose a casing structure with functionality of effective thermal management for being applied in an electronic device by a form of a top casing and/or a back casing. The casing structure comprises a casing member, a low thermal conductivity medium, a second heat spreader, and a first heat spreader. In case of a user operating the electronic device, heat generated from a heat source like CPU or GPU is thermally transferred to the second heat spreader via the first heat spreader, and then is two-dimensionally spread in the second heat spreader. Consequently, the heat is dissipated away from the casing member to air due to the outstanding thermal radiation ability of the casing member. Particularly, the present invention let the low thermal conductivity medium be disposed between the second heat spreader and the casing member, such that the low thermal conductivity medium is able to control heat transfer of heat transferring paths from the heat source to the casing member. Therefore, by applying the casing structure in an electronic device by a form of a top casing and/or a back casing, an outer surface temperature of the casing member can be well controlled because the heat generated by the heat source is continuously dissipated away from the casing member to air.

It is worth explaining that, since the casing member possesses an outstanding thermal radiation ability, the heat transferred to the casing member would be massively radiated to air through the outer surface of the casing member. Briefly speaking, letting the casing structure be applied in an electronic device not only achieves a good thermal management of the heat source (such as CPU and GPU) in the electronic device (like a laptop computer), but also make the outer surface temperature (i.e., skin temperature) of the casing member (e.g., D cover of the laptop computer) be well controlled. Therefore, in case of a user putting the laptop computer that is integrated with the casing structure with functionality of effective thermal management of the present invention on his thighs and then operating it, the user's thighs would not be scalded by the D cover of the laptop computer, or feel any uncomfortable resulted from the high-temperature outer surface of the D cover.

In order to achieve the primary objective of the present invention, the inventor of the present invention provides a first embodiment for the casing structure with functionality of effective thermal management, which is applied in an electronic device for achieving a heat dissipation of a heat source, and comprises:

at least one first heat spreader, being disposed on the heat source;

a second heat spreader, being disposed on the first heat spreader, such that heat generated from the heat source is thermally transferred to the second heat spreader via the first heat spreader, and then being two-dimensionally spread in the second heat spreader;

a low thermal conductivity medium, being disposed on the second heat spreader; and a casing member, being disposed on the low thermal conductivity medium, such that the heat thermally transferred from the low thermal conductivity medium to the casing member is consequently dissipated away from the casing member to air;

wherein the low thermal conductivity medium is adopted for controlling heat transfer of heat transferring paths from the heat source to the casing member, so as to well controlled an outer surface temperature of the casing member during the heat being dissipated into air.

For achieving the primary objective of the present invention, the inventor of the present invention provides a second embodiment for the casing structure with functionality of effective thermal management, which is applied in an electronic device for achieving a heat dissipation of a heat source, and comprises:

at least one first heat spreader, being disposed on the heat source;

a second heat spreader, being disposed on the first heat spreader, such that heat generated from the heat source is thermally transferred to the second heat spreader via the first heat spreader, and then being two-dimensionally spread in the second heat spreader;

a low thermal conductivity medium, being disposed on the second heat spreader;

a casing member, being disposed on the low thermal conductivity medium, such that the heat thermally transferred from the low thermal conductivity medium to the casing member is consequently dissipated away from the casing member to air; and an elastic pressing unit, being disposed between the second heat spreader and the casing member, and being embedded into the low thermal conductivity medium;

wherein the elastic pressing unit is adopted for making the low thermal conductivity medium be tightly attached onto an inner surface of the casing member by applying an elastic force to the low thermal conductivity medium;

wherein the elastic pressing unit having a low thermal conductivity member that contacts the second heat spreader and is embedded in the low thermal conductivity medium, such that the low thermal conductivity medium and the low thermal conductivity member is able to control heat transfer of heat transferring paths from the heat source to the casing member, so as to well controlled an outer surface temperature of the casing member during the heat being dissipated into air.

Moreover, in order to achieve the primary objective of the present invention, the inventor of the present invention provides a third embodiment for the casing structure with functionality of effective thermal management, which is applied in an electronic device for achieving a heat dissipation of a heat source, and comprises:

at least one first heat spreader, being disposed on the heat source;

a second heat spreader, being disposed on the first heat spreader, such that heat generated from the heat source is thermally transferred to the second heat spreader via the first heat spreader, and then being two-dimensionally spread in the second heat spreader;

a low thermal conductivity medium, being disposed on the second heat spreader; and a casing member, being disposed on the low thermal conductivity medium, such that the heat thermally transferred from the low thermal conductivity medium to the casing member is consequently dissipated away from the casing member to air; and a honeycomb structure with a plurality of pores, being formed on an inner surface of the casing member for being located between the low thermal conductivity medium and the casing member, so as to let the plurality of pores become a plurality of are gaps between the casing member and the low thermal conductivity medium;

wherein the low thermal conductivity medium is adopted for controlling heat transfer of heat transferring paths from the heat source to the casing member, so as to well controlled an outer surface temperature of the casing member during the heat being dissipated into air.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a casing structure with functionality of effective thermal management disclosed by the present invention, embodiments of the present invention will be described in detail with reference to the attached drawings hereinafter.

First Embodiment

Figure 1:
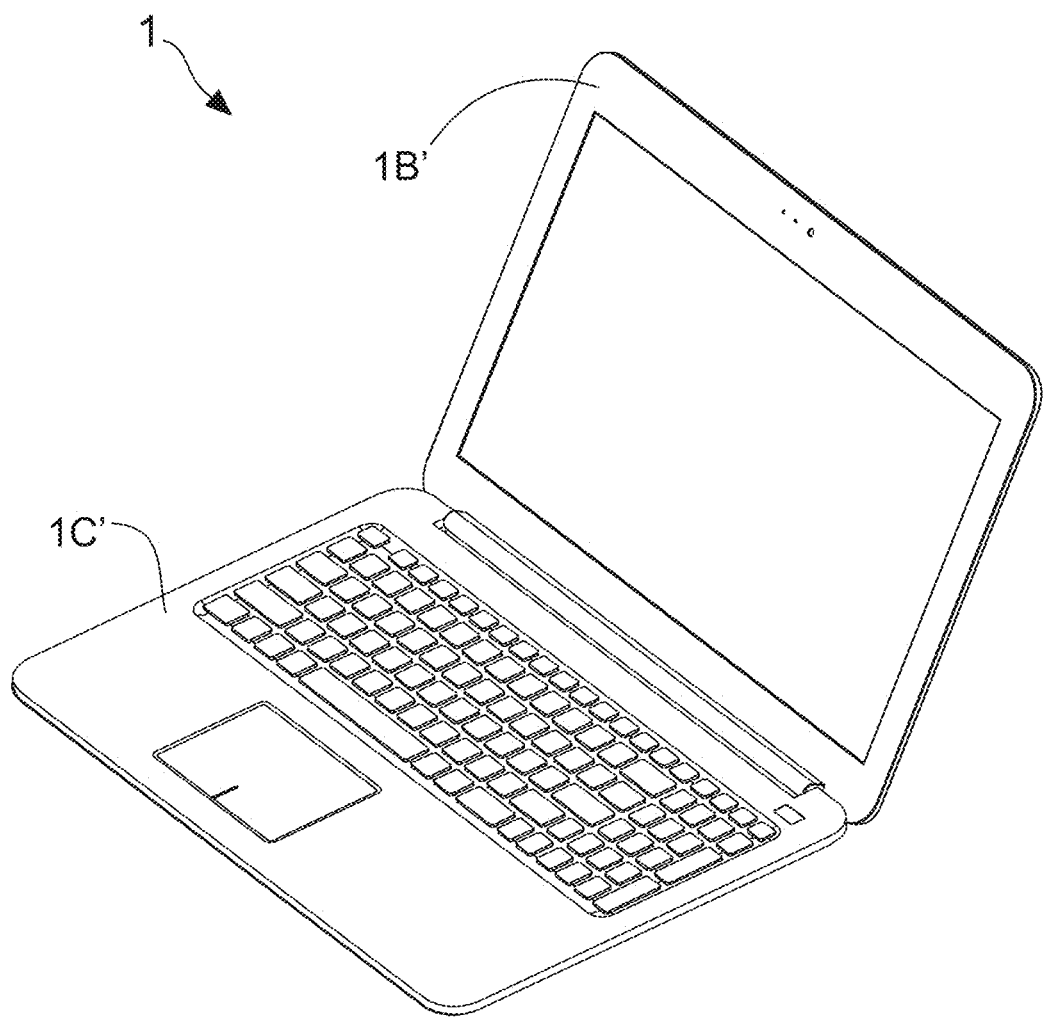
FIG. 1 shows a stereo diagram of a laptop computer.
Figure 2:
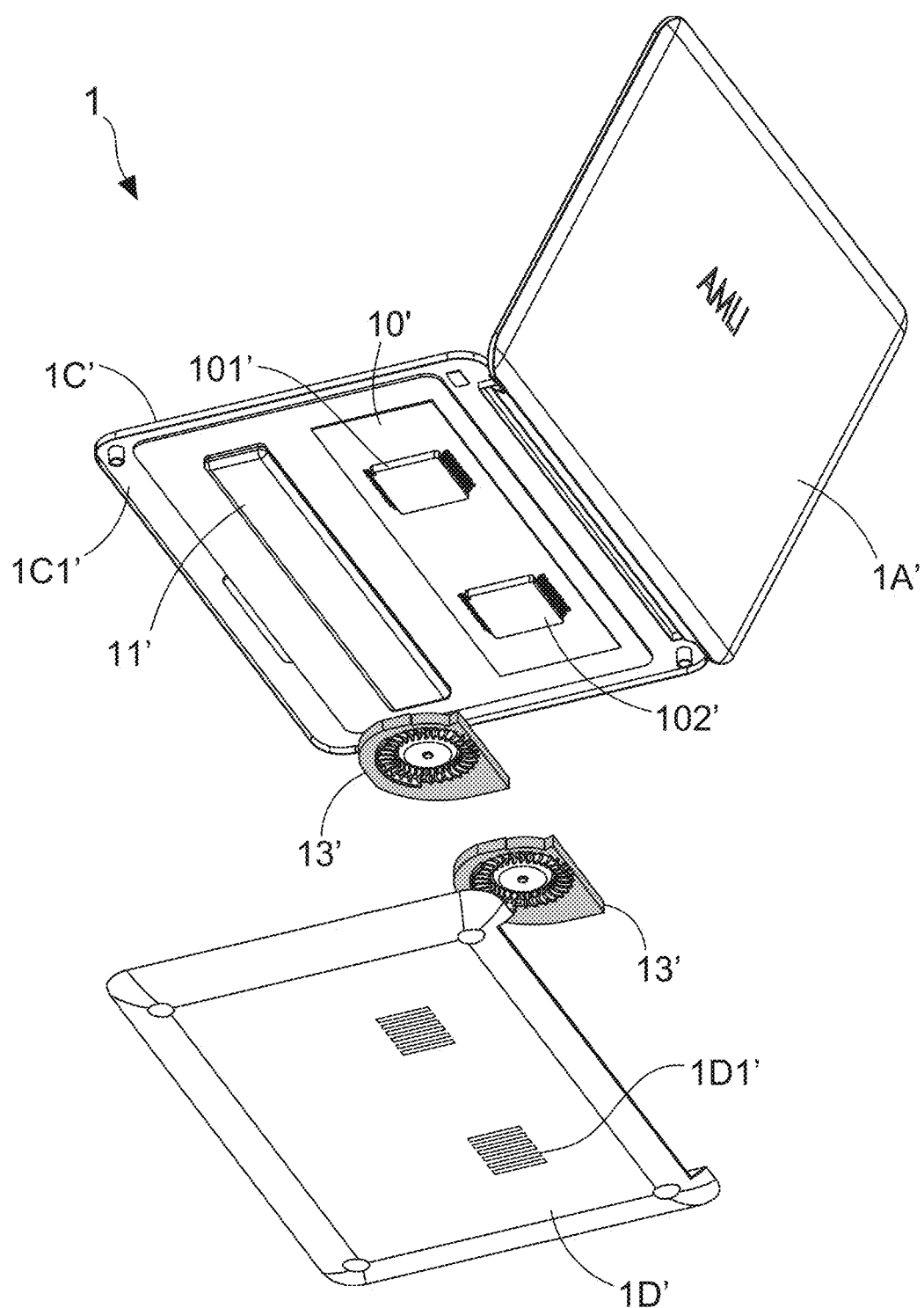
FIG. 2 shows an exploded diagram of a portion of constituting elements of the laptop computer.
Figure 3:
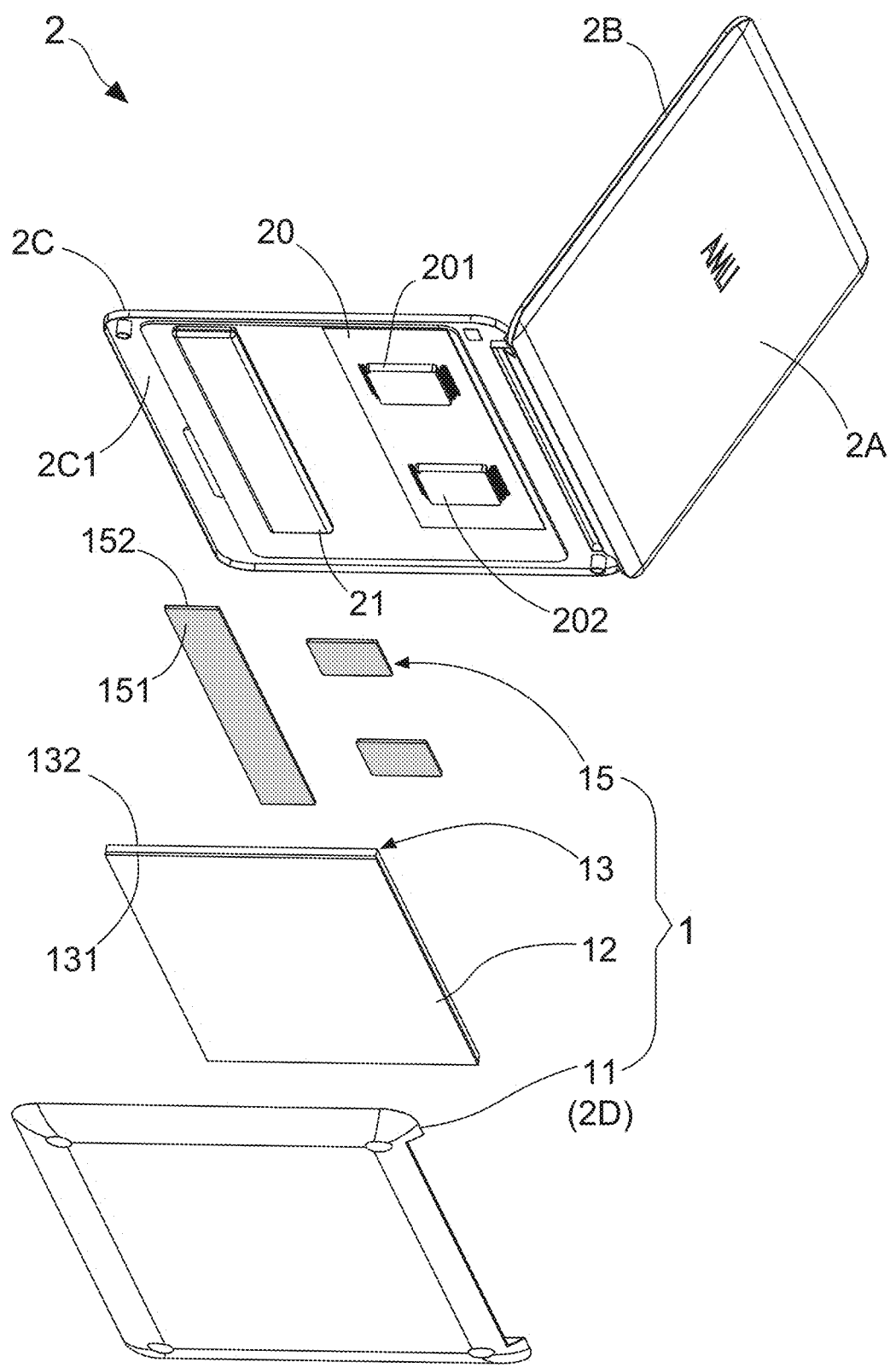
FIG. 3 shows one perspective stereo diagram of an electronic device having a casing structure with functionality of effective thermal management according to the present invention.
Figure 4:
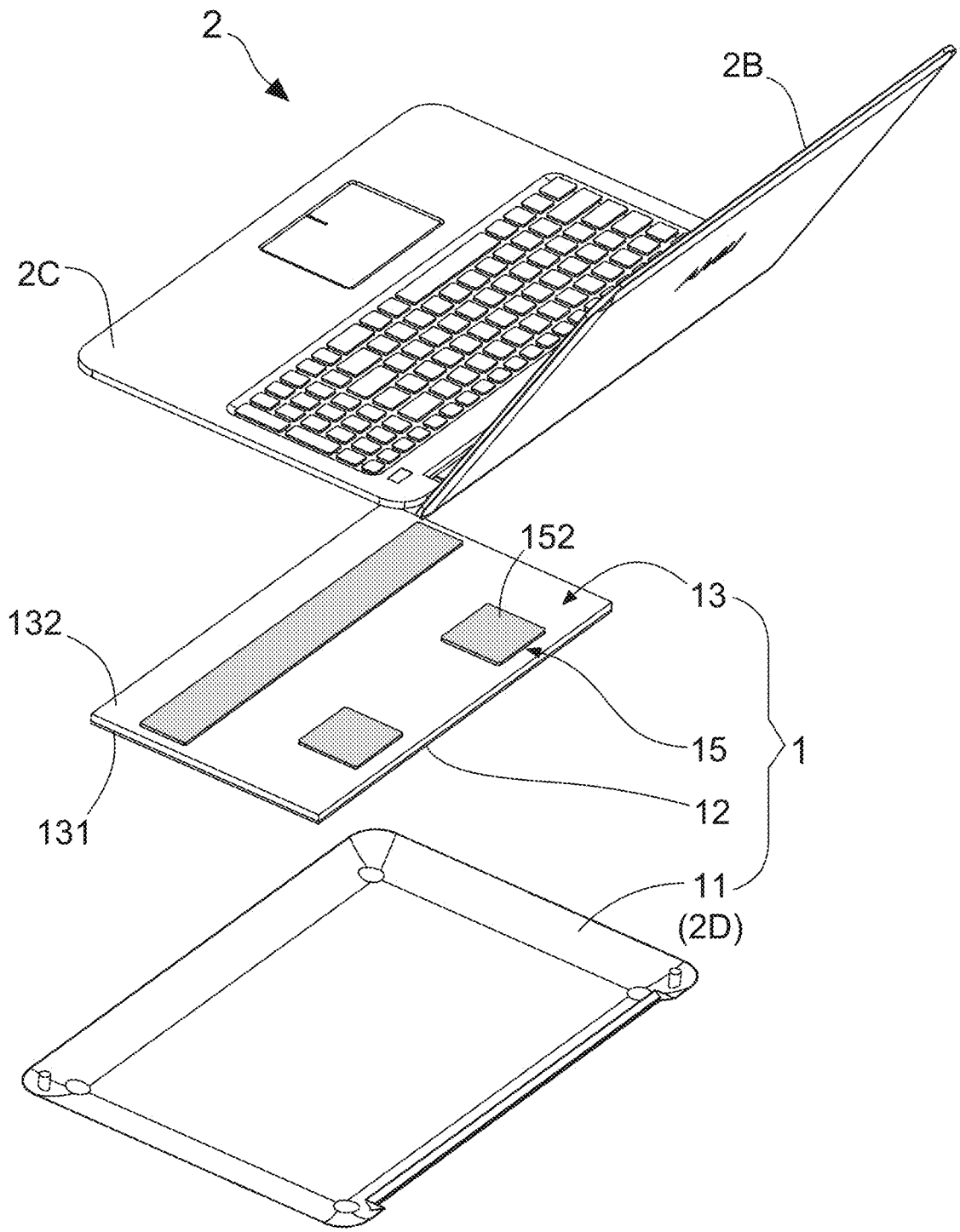
FIG. 4 shows another one perspective stereo diagram of the electronic device having the casing structure with functionality of effective thermal management according to the present invention.

FIG. 3 shows one perspective stereo diagram of an electronic device that having a casing structure with functionality of effective thermal management according to the present invention, and FIG. 4 illustrates another one perspective stereo diagram of the electronic device that having the casing structure with functionality of effective thermal management according to the present invention. The present invention discloses a casing structure 1 with functionality of effective thermal management for being applied in an electronic device 2 by a form of a top casing and/or a back casing. For example, FIG. 3 and FIG. 4 depict that the electronic device 2 is a laptop computer comprising a first casing of a display device and a second casing of a host device. In which, the first casing consists of a rear cover 2A and a front panel 2B, and the second casing consists of a base cover 2D and a top cover 2C. From FIG. 3 and FIG. 4, it is found that a lithium battery 21 and a main board 20 provided with a CPU 201 and a GPU 202 are disposed in an accommodation space 2C1 of the top cover 2C. Engineers skilled in development and manufacture of the laptop computer certainly know that, the lithium battery 21, the CPU 201, and the GPU 202 are the principal heat source in the laptop computer.

In first embodiment, the casing structure 1 of the present invention comprises a casing member 11 made of a metal material, a low thermal conductivity medium 12, a second heat spreader 13, and at least one first heat spreaders 15. The low thermal conductivity medium 12 is connected to an inner surface of the casing member 11, and the second heat spreader 13 is connected to the low thermal conductivity medium 12 by a first surface 131 thereof. On the other hand, the first heat spreader 15 can be a semiconductor substrate, graphite sheet, a sheet-metal radiator, or a sheet-ceramic radiator, and is connected to a second surface 131 of the second heat spreader 13 by a first surface 151 thereof. Moreover, the first heat spreaders 15 are connected to a hard disk drive (not shown), the lithium battery 21, the CPU 201 and the GPU 202 (i.e., the heat source) of the electronic device 2 by a second surface 152 thereof.

From FIG. 3 and FIG. 4, it is able to find that the casing member 11 is the base cover 2D of the laptop computer (i.e., the electronic device 2). In first embodiment, the casing member 11(2D) is made of a metal material such as magnesium (Mg) alloy, aluminum (Al) alloy, iron (Fe) alloy, titanium (Ti) alloy, or others metallic alloy. However, in other practicable embodiment, the casing member 11(2D) can also be made of a non-metal material like plastic, carbon fiber or glass.

Figure 5:
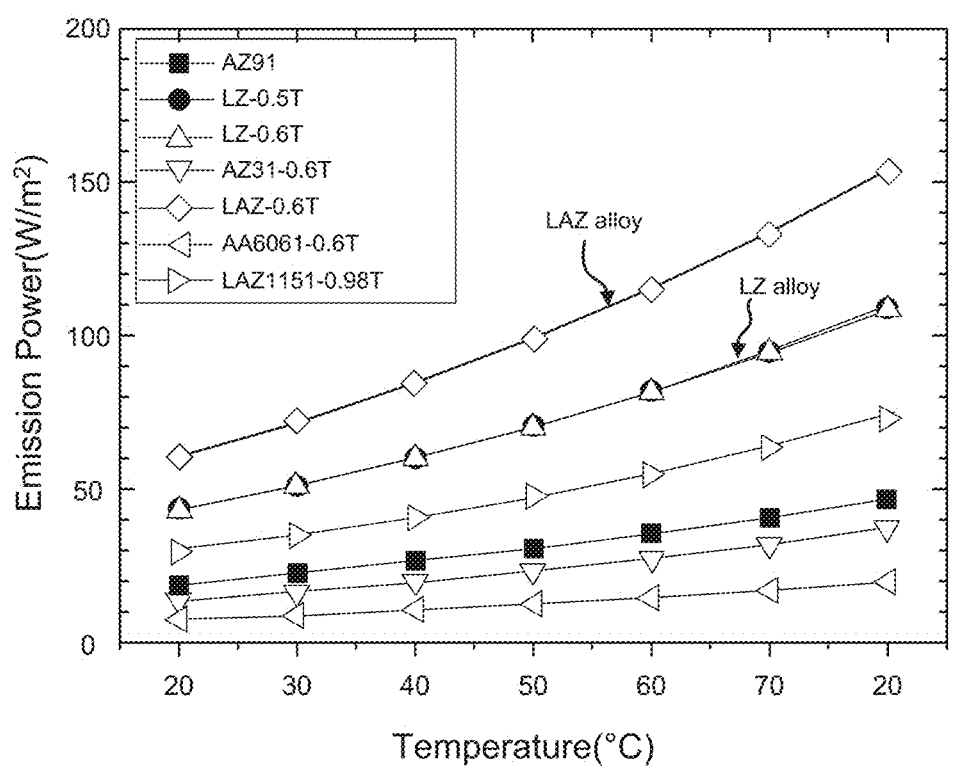
FIG. 5 shows a curve plot of temperature versus emission power of various metal materials.

FIG. 5 shows a curve plot of temperature versus emission power of various metal materials. It is worth further explaining that, Mg—Li alloy is composed of Mg-xLi, and is a lightweight alloy because of having a density that is less than 1.6 g/cm$^3$. As described in more detail below, (Mg-12 wt % Li)LZ12 is one kind of Mg—Li alloy, and comprises: principal element Mg, Li of 12 wt % and at least one minor element like Zn, Al, Y, and/or Mn. Moreover, (Mg-12 wt % Li-1 wt % Zn)LZ121 is also one kind of Mg—Li alloy, and comprises: principal element Mg, Li of 12 wt %, Zn of 1 wt %, and at least one minor element. On the other hand, (Mg-9 wt % Li-3 wt % Al-3 wt % Zn)LAZ933 is one kind of Mg—Li—Al alloy, and comprises: principal element Mg, Li of 9 wt %, Al of 3 wt %, Zn of 3 wt %, and at least one minor element. From data of FIG. 5, it is understood that, LAZ (Mg—Li—Al) alloys exhibit the best thermal radiation ability, and the LZ (Mg—Li) alloys perform the next best thermal radiation ability.

Figure 6:
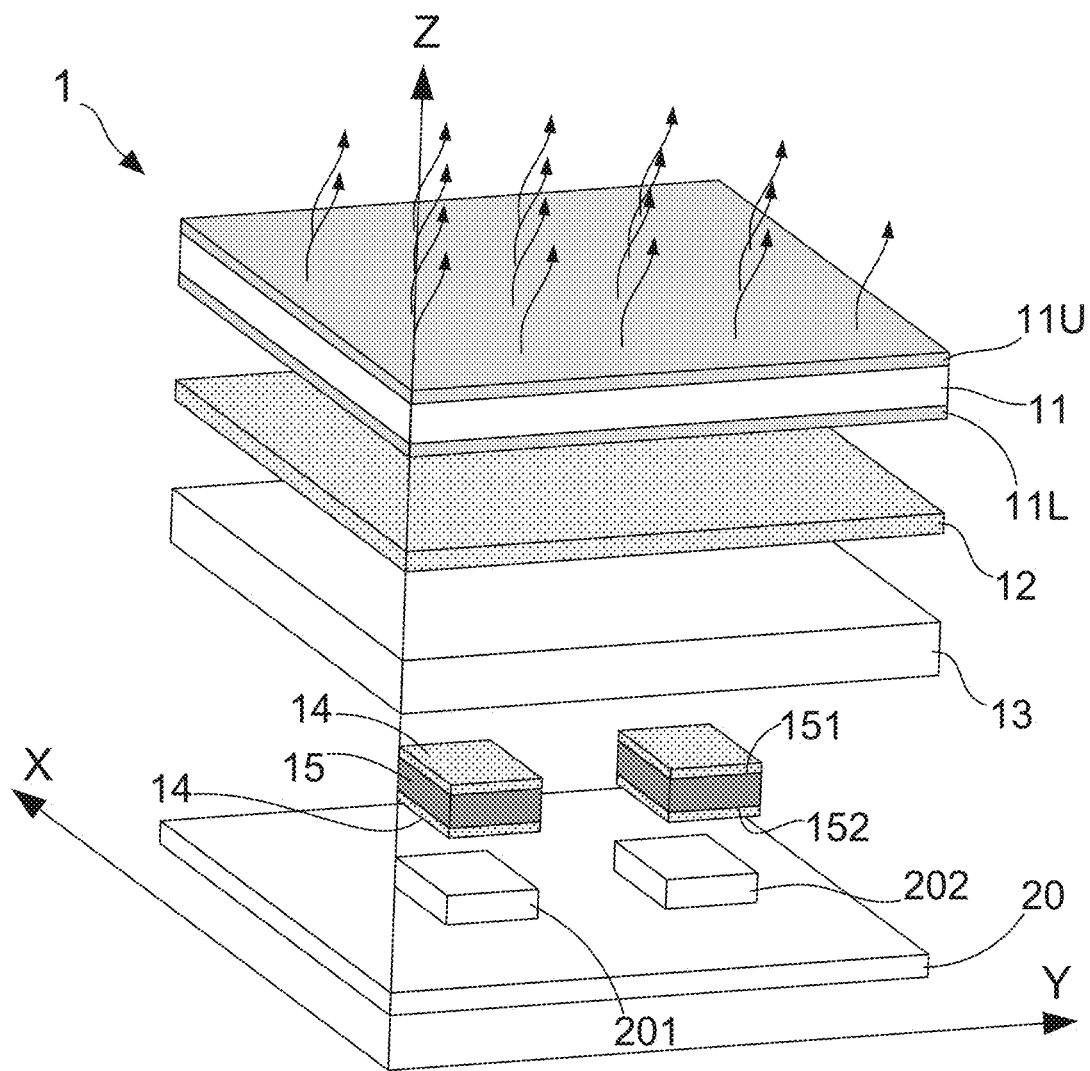
FIG. 6 shows a schematic exploded diagram of the casing structure with functionality of effective thermal management according to the present invention.
Figure 7:
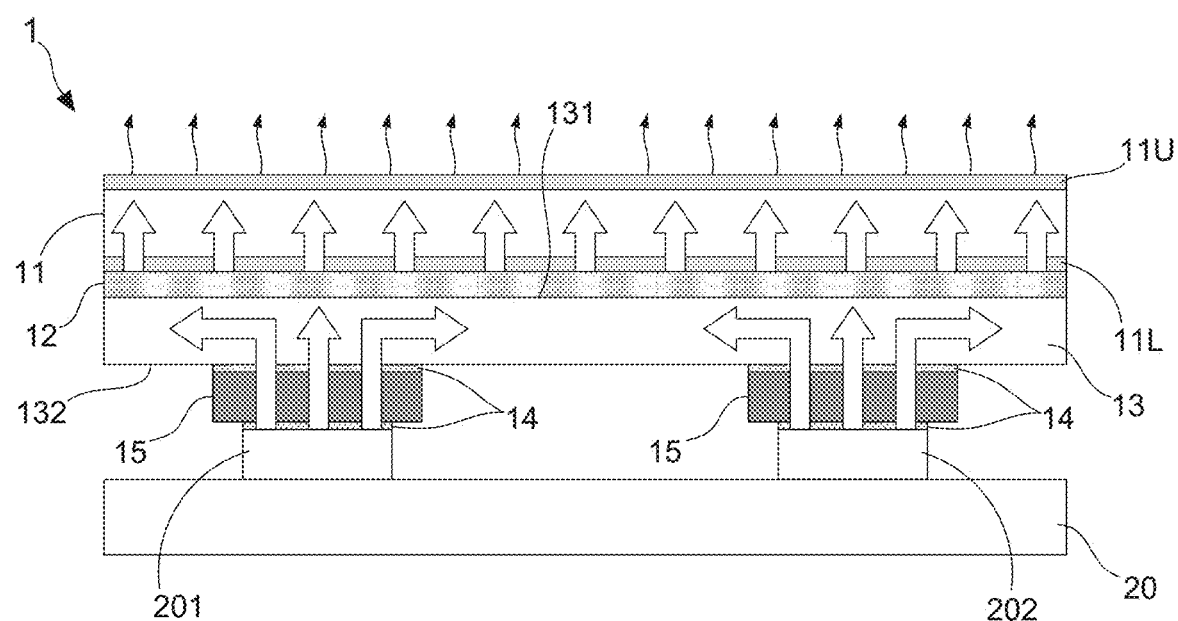
FIG. 7 shows a schematic cross-sectional view of the casing structure with functionality of effective thermal management according to the present invention.

Referring to FIG. 3 and FIG. 4 again, and please refer to FIG. 6 and FIG. 7, wherein FIG. 6 and FIG. 7 show a schematic exploded diagram and a schematic cross-sectional view of the casing structure 1. In the present invention, a medium member that has a thermal conductivity less than or equal to 0.2 W/m·K is adopted for being as the low thermal conductivity medium 12. For example, pressure sensitive adhesive (PSA), aerogel, Kapton®, polyimide adhesive tape, or Nano silica balloon insulator sheet (NASBIS). On the other hand, in a practicable embodiment, the second heat spreader 13 can be a vapor chamber (VC), a metal thermal ground plane (TGP) and a polymer TGP. Engineers skilled in development and research of thermal solution should know that, since a fluid transportation inside the vapor chamber is two dimensional, the vapor chamber has a two-dimensional thermal conduction characteristic. Moreover, the casing member 11(2D) is formed with a first surface treatment coating 11L on the inner surface thereon, and is also formed with a second surface treatment coating 11U on an outer surface thereon. In a practicable embodiment, the first surface treatment coating 11L and the second surface treatment coating 11U can both be selected from the group consisting of anodizing treatment and ceramic coating.

By such specific structural design for the casing structure 1 of the present invention, in case of the laptop computer being normal operated by a user, heat generated from the heat source including hard disk drive, lithium battery 21, the CPU 201, and the GPU 202 is thermally transferred to the second surface 132 of the second heat spreader 13 through the first heat spreader 15, and then is two-dimensionally spread in the second heat spreader 13 so as to be further uniformly transferred to the first surface 131 of the second heat spreader 13. According to the present invention, the low thermal conductivity medium 12 is adopted for controlling heat transfer of heat transferring paths from the heat source to the casing member 11(2D), so as to well controlled an outer surface temperature of the casing member 11(2D) during the heat being dissipated into air by the outer surface of the casing member 11(2D). It is worth explaining that, since the casing member 11(2D) possesses an outstanding thermal radiation ability, the heat transferred to the casing member 11(2D) would be massively radiated to air through the outer surface of the casing member 11(2D). Briefly speaking, letting the casing structure 1 be applied in an electronic device 2 not only achieves a good thermal management of the heat source (such as CPU 201 and GPU 202) in the electronic device 2 (like a laptop computer), but also make the outer surface temperature (i.e., skin temperature) of the casing member 11 (e.g., D cover 2D of the laptop computer) be well controlled. Therefore, in case of a user putting the laptop computer that is integrated with the casing structure 1 with functionality of effective thermal management of the present invention on his thighs and then operating it, the user's thighs would not be scalded by the D cover of the laptop computer, or feel any uncomfortable resulted from the high-temperature outer surface of the D cover.

Please refer to FIG. 3, FIG. 4, FIG. 6, and FIG. 7 again. In the present invention, the low thermal conductivity medium 12 is adopted for controlling heat transfer of heat transferring paths from the heat source to the casing member 11(2D), so as to well controlled an outer surface temperature of the casing member 11(2D) during the heat being dissipated into air. However, use of the low thermal conductivity medium 12 may lead a first junction temperature measured at a first junction between the first surface 151 of the first heat spreader 15 and the second surface 132 of the second heat spreader 13 as well as a second junction temperature measured at a second junction between the heat source and the second surface of the first heat spreader 15 to rise. Therefore, when applying the casing structure 1 of the present invention in an electronic device 2, it needs to simultaneously concern that the CPU 201 and the GPU 202 working in high operating load would generate high temperature so as to cause a thermal mismatch occur between the heat source, the first heat spreader 15 and the second heat spreader 13.

For preventing occurrence of the thermal mismatch, as FIG. 6 and FIG. 7 show, a thermal interface material 14 is disposed between the heat source and the first heat spreader 15, and the thermal interface material 14 is also disposed between the first heat spreader 15 and the second heat spreader 13. In one practicable embodiment, the thermal interface material 14 is thermal grease, which not only provides an adhesive force between the heat source and the first heat spreader 15 as well as between the first heat spreader 15 and the second heat spreader 13, but also prevent the thermal mismatch occurring between the heat source, the first heat spreader 15 and the second heat spreader 13. Of course, the thermal interface material 14 is not limited to be thermal grease, which can be any other thermally conductive materials.

Furthermore, at least one fastening member can be used in the casing structure 1 of the present invention, so as to tightly fix the second heat spreader 13 and the low thermal conductivity medium 12 onto the inner surface of the casing member 11(2D). Moreover, by the use of the fastening member, connection tightness between the heat source and the first heat spreader 15, the first heat spreader 15 and the second heat spreader 13, and/or the second heat spreader 13 and the low thermal conductivity medium 12 can be properly adjusted for preventing occurrence of thermal mismatch. The said fastening member can be a drilling screw, a snapping member or an embedded mechanism. Herein, it is worth further explaining that, taking a double-sided tape made of a low thermal conductivity material as the low thermal conductivity medium 12 is helpful in adjusting the connection tightness between the second heat spreader 13 and the low thermal conductivity medium 12 as well as between the low thermal conductivity medium 12 and the casing member 11(2D). For example, Kapton® double-sided thin polyimide tape is one kind of the forgoing double-sided tape with low thermal conductivity property.

Second Embodiment

Figure 8:
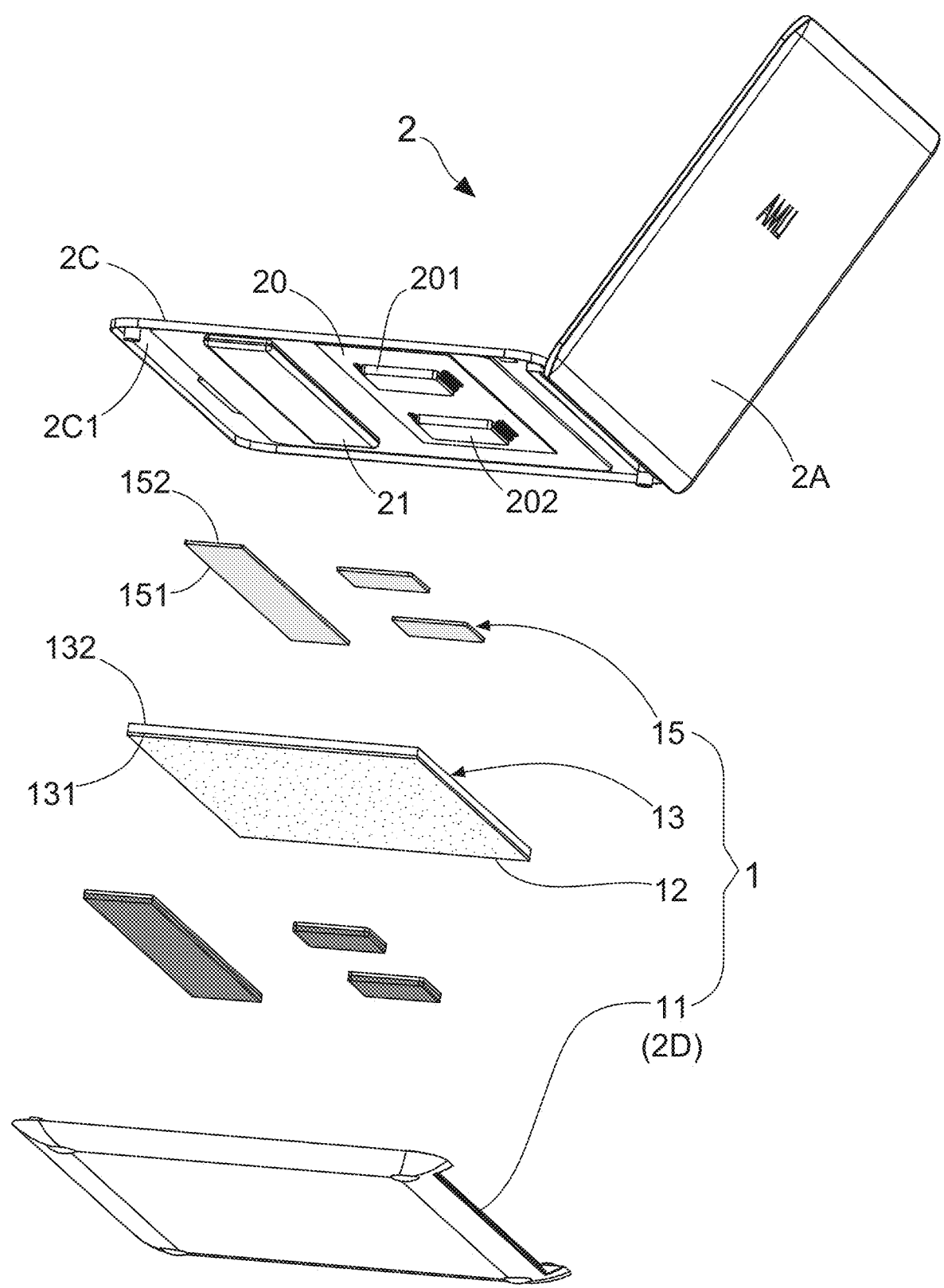
FIG. 8 shows one perspective stereo diagram of an electronic device having a casing structure with functionality of effective thermal management according to the present invention.
Figure 9:
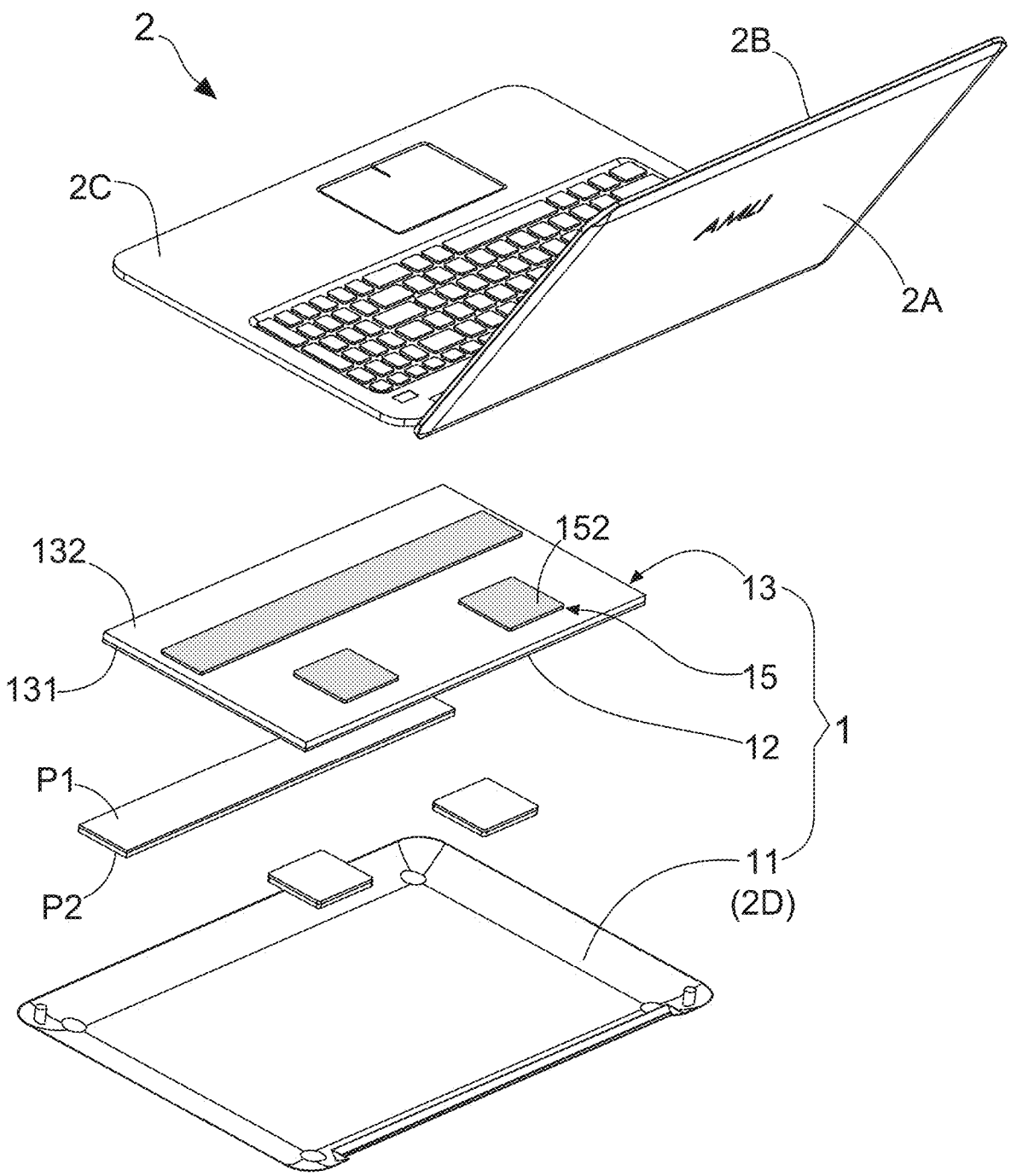
FIG. 9 shows another one perspective stereo diagram of the electronic device having the casing structure with functionality of effective thermal management according to the present invention.

FIG. 8 shows one perspective stereo diagram of an electronic device that having a casing structure with functionality of effective thermal management according to the present invention, and FIG. 9 illustrates another one perspective stereo diagram of the electronic device that having the casing structure with functionality of effective thermal management according to the present invention. The present invention discloses a casing structure 1 with functionality of effective thermal management for being applied in an electronic device 2 by a form of a top casing and/or a back casing. For example, FIG. 8 and FIG. 9 depict that the electronic device 2 is a laptop computer comprising a first casing of a display device and a second casing of a host device. In which, the first casing consists of a rear cover 2A and a front panel 2B, and the second casing consists of a base cover 2D and a top cover 2C. From FIG. 8 and FIG. 9, it is found that a lithium battery 21 and a main board 20 provided with a CPU 201 and a GPU 202 are disposed in an accommodation space 2C1 of the top cover 2C. Engineers skilled in development and manufacture of the laptop computer certainly know that, the lithium battery 21, the CPU 201, and the GPU 202 are the principal heat source in the laptop computer.

In second embodiment, the casing structure 1 of the present invention comprises a casing member 11 made of a metal material, a low thermal conductivity medium 12, a second heat spreader 13, a plurality of first heat spreaders 15, an elastic pressing unit comprising a low thermal conductivity member P1 and an elastic member P2. The low thermal conductivity medium 12 is connected to an inner surface of the casing member 11, and the second heat spreader 13 is connected to the low thermal conductivity medium 12 by a first surface 131 thereof. On the other hand, the first heat spreader 15 can be a semiconductor substrate, graphite sheet, a sheet-metal radiator, or a sheet-ceramic radiator, and is connected to a second surface 131 of the second heat spreader 13 by a first surface 151 thereof. Moreover, the first heat spreaders 15 are connected to a hard disk drive (not shown), the lithium battery 21, the CPU 201 and the GPU 202 (i.e., the heat source) of the electronic device 2 by a second surface 152 thereof.

From FIG. 8 and FIG. 9, it can find that the casing member 11 is the base cover 2D of the laptop computer (i.e., the electronic device 2). In first embodiment, the casing member 11(2D) is made of a metal material such as magnesium (Mg) alloy, aluminum (Al) alloy, iron (Fe) alloy, titanium (Ti) alloy, or others metallic alloy. However, in other practicable embodiment, the casing member 11(2D) can also be made of a non-metal material like plastic, carbon fiber or glass.

FIG. 5 shows a curve plot of temperature versus emission power of various metal materials. It is worth further explaining that, Mg—Li alloy is composed of Mg-xLi, and is a lightweight alloy because of having a density that is less than 1.6 g/cm$^3$. As described in more detail below, (Mg-12 wt % Li)LZ12 is one kind of Mg—Li alloy, and comprises: principal element Mg, Li of 12 wt % and at least one minor element like Zn, Al, Y, and/or Mn. Moreover, (Mg-12 wt % Li-1 wt % Zn)LZ121 is also one kind of Mg—Li alloy, and comprises: principal element Mg, Li of 12 wt %, Zn of 1 wt %, and at least one minor element. On the other hand, (Mg-9 wt % Li-3 wt % Al-3 wt % Zn)LAZ933 is one kind of Mg—Li—Al alloy, and comprises: principal element Mg, Li of 9 wt %, Al of 3 wt %, Zn of 3 wt %, and at least one minor element. From data of FIG. 5, it is understood that, LAZ (Mg—Li—Al) alloys exhibit the best thermal radiation ability, and the LZ (Mg—Li) alloys perform the next best thermal radiation ability.

Figure 10:
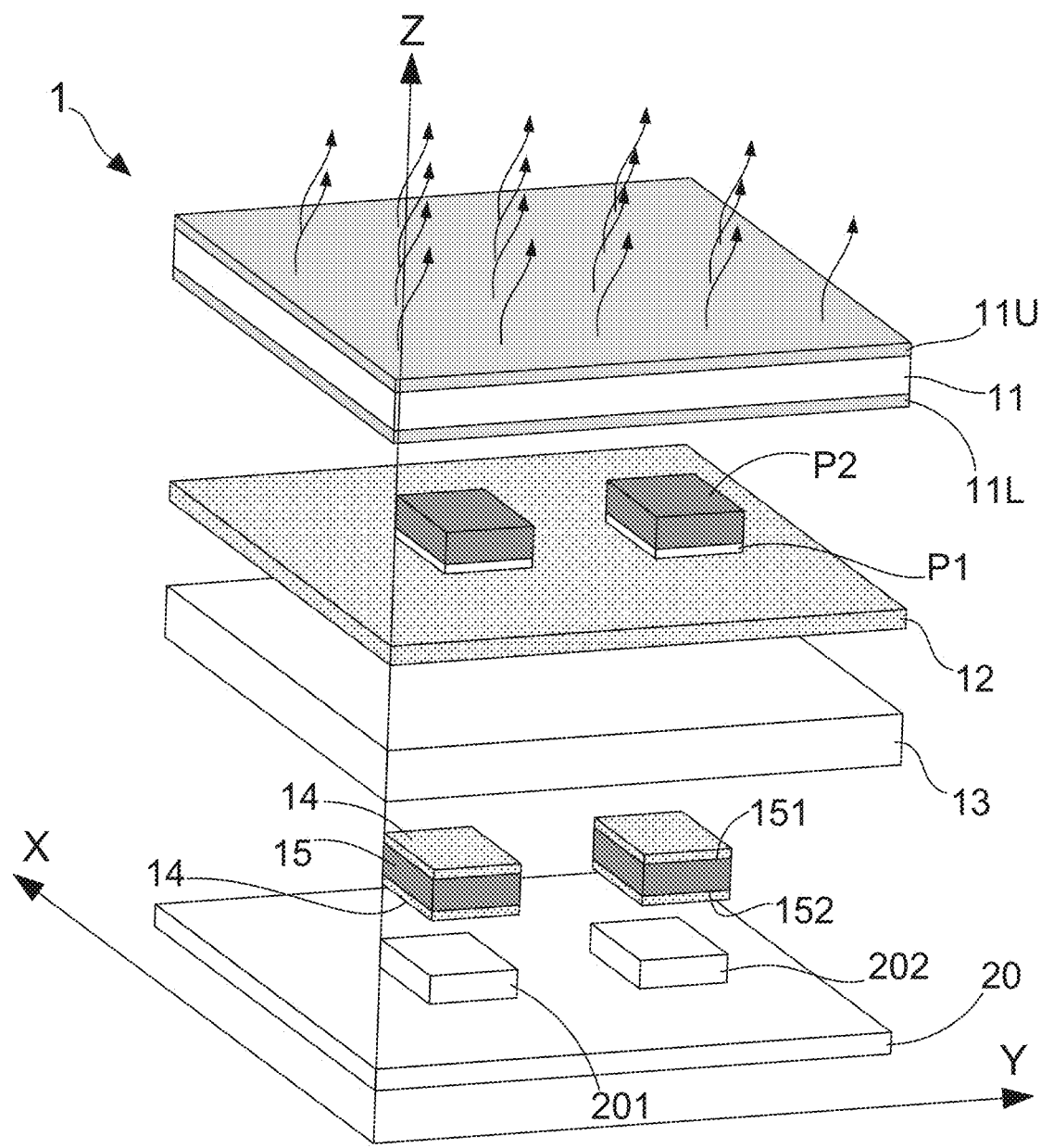
FIG. 10 shows a schematic exploded diagram of the casing structure with functionality of effective thermal management according to the present invention.
Figure 11:
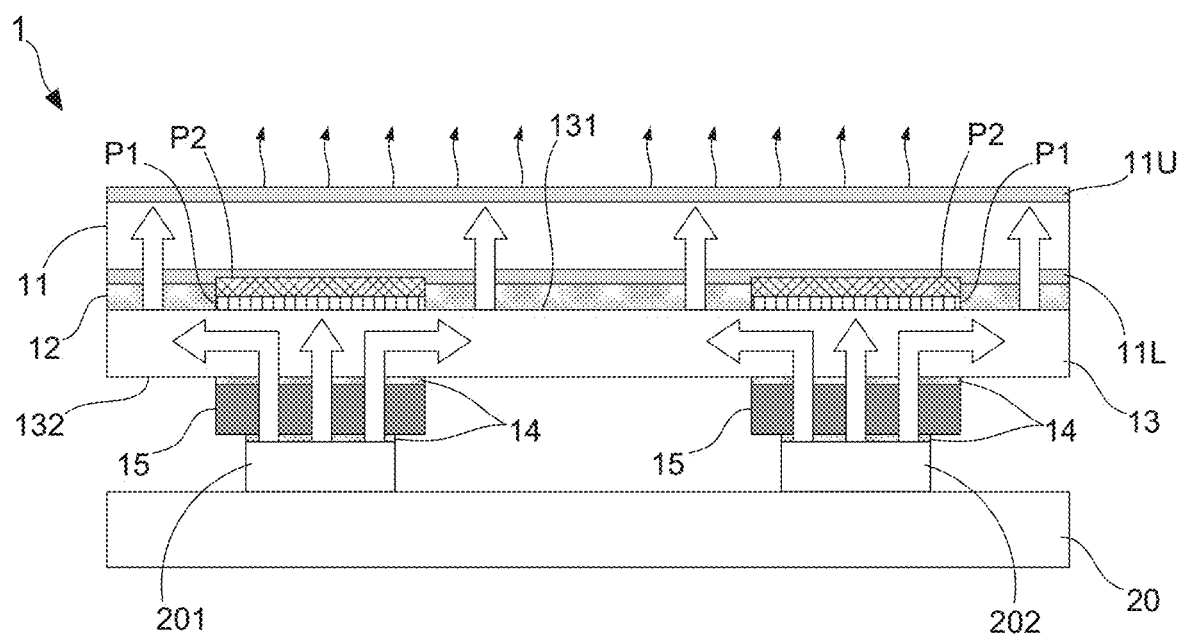
FIG. 11 shows a schematic cross-sectional view of the casing structure with functionality of effective thermal management according to the present invention.

Referring to FIG. 8 and FIG. 9 again, and please refer to FIG. 10 and FIG. 11, wherein FIG. 10 and FIG. 11 show a schematic exploded diagram and a schematic cross-sectional view of the casing structure 1. In the present invention, a medium member that has a thermal conductivity less than or equal to 0.2 W/m·K is adopted for being as the low thermal conductivity medium 12. For example, pressure sensitive adhesive (PSA), aerogel, Kapton®, polyimide adhesive tape, or Nano silica balloon insulator sheet (NASBIS). On the other hand, in a practicable embodiment, the second heat spreader 13 can be a vapor chamber (VC), a metal thermal ground plane (TGP) and a polymer TGP. Engineers skilled in development and research of thermal solution should know that, since a fluid transportation inside the vapor chamber is two dimensional, the vapor chamber has a two-dimensional thermal conduction characteristic. Moreover, the casing member 11(2D) is formed with a first surface treatment coating 11L on the inner surface thereon, and is also formed with a second surface treatment coating 11U on an outer surface thereon. In a practicable embodiment, the first surface treatment coating 11L and the second surface treatment coating 11U can both be selected from the group consisting of anodizing treatment and ceramic coating.

As FIG. 8, FIG. 9, FIG. 10, and FIG. 11 show, the elastic pressing unit comprising a low thermal conductivity member P1 and an elastic member P2 is disposed between the second heat spreader 13 and the casing member 11(2D). The low thermal conductivity member P1 contacts the second heat spreader 13 and is embedded in the low thermal conductivity medium 12, such that the low thermal conductivity medium 12 and the low thermal conductivity member P1 are able to reduce the heat transfer rate of the heat transferring path. On the other hand, the elastic member P2 is disposed on the low thermal conductivity member P1 for applying an elastic force to the low thermal conductivity member P1 and the low thermal conductivity medium 12, so as to make the low thermal conductivity medium 12 be tightly attached onto an inner surface of the casing member 11(2D). By such specific structural design for the casing structure 1 of the present invention, in case of the laptop computer being normal operated by a user, heat generated from the heat source including hard disk drive, lithium battery 21, the CPU 201, and the GPU 202 is thermally transferred to the second surface 132 of the second heat spreader 13 through the first heat spreader 15, and then is two-dimensionally spread in the second heat spreader 13 so as to be further uniformly transferred to the first surface 131 of the second heat spreader 13. According to the present invention, the low thermal conductivity medium 12 and the low thermal conductivity member P1 are adopted for controlling heat transfer of heat transferring paths from the heat source to the casing member 11(2D), so as to well controlled an outer surface temperature of the casing member 11(2D) during the heat being dissipated into air by the outer surface of the casing member 11(2D).

Please refer to FIG. 8, FIG. 9, FIG. 10, and FIG. 11 again. In the present invention, the low thermal conductivity medium 12 is adopted for controlling heat transfer of heat transferring paths from the heat source to the casing member 11(2D), so as to well controlled an outer surface temperature of the casing member 11(2D) during the heat being dissipated into air. However, use of the low thermal conductivity medium 12 may lead a first junction temperature measured at a first junction between the first surface 151 of the first heat spreader 15 and the second surface 132 of the second heat spreader 13 as well as a second junction temperature measured at a second junction between the heat source and the second surface of the first heat spreader 15 to rise. Therefore, when applying the casing structure 1 of the present invention in an electronic device 2, it needs to simultaneously concern that the CPU 201 and the GPU 202 working in high operating load would generate high temperature so as to cause a thermal mismatch occur between the heat source, the first heat spreader 15 and the second heat spreader 13.

For preventing occurrence of the thermal mismatch, as FIG. 10 and FIG. 11 show, a thermal interface material 14 is disposed between the heat source and the first heat spreader 15, and the thermal interface material 14 is also disposed between the first heat spreader 15 and the second heat spreader 13. In one practicable embodiment, the thermal interface material 14 is thermal grease, which not only provides an adhesive force between the heat source and the first heat spreader 15 as well as between the first heat spreader 15 and the second heat spreader 13, but also prevent the thermal mismatch occurring between the heat source, the first heat spreader 15 and the second heat spreader 13. Of course, the thermal interface material 14 is not limited to be thermal grease, which can be any other thermally conductive materials.

After comparing FIG. 11 with FIG. 7, it is able to understand that, the second embodiment of the casing structure 1 of the present invention is obtained by adding one elastic pressing unit into the forgoing first embodiment. Briefly speaking the second embodiment of the casing structure 1 comprises a casing member 11 made of a metal material, a low thermal conductivity medium 12, a second heat spreader 13, at least one first heat spreaders 15, and an elastic pressing unit comprising a low thermal conductivity member P1 and an elastic member P2. As FIG. 11 shows, the low thermal conductivity member P1 contacts the second heat spreader 13 and is embedded in the low thermal conductivity medium 12, such that the low thermal conductivity medium 12 and the low thermal conductivity member P1 are able to control the heat transfer of the heat transferring paths. Moreover, the elastic member P2 is disposed on the low thermal conductivity member P1 for applying an elastic force to the low thermal conductivity member P1 and the low thermal conductivity medium 12, so as to make the low thermal conductivity medium 12 be tightly attached onto an inner surface of the casing member 11(2D).

In one practicable embodiment, the low thermal conductivity member P1 can be an aerogel or an air gap. Moreover, taking spring sheet as the elastic member P2 is helpful in not only adjusting the connection tightness between the second heat spreader 13 and the first heat spreader 15 as well as between the first heat spreader 15 and the heat source, but also preventing the occurrence of thermal mismatch.

Furthermore, at least one fastening member can be used in the casing structure 1 of the present invention, so as to tightly fix the second heat spreader 13 and the low thermal conductivity medium 12 onto the inner surface of the casing member 11(2D). Moreover, by the use of the fastening member, connection tightness between the heat source and the first heat spreader 15, the first heat spreader 15 and the second heat spreader 13, and/or the second heat spreader 13 and the low thermal conductivity medium 12 can be properly adjusted for preventing occurrence of thermal mismatch. The said fastening member can be a drilling screw, a snapping member or an embedded mechanism. Herein, it is worth further explaining that, taking a double-sided tape made of a low thermal conductivity material as the low thermal conductivity medium 12 is helpful in adjusting the connection tightness between the second heat spreader 13 and the low thermal conductivity medium 12 as well as between the low thermal conductivity medium 12 and the casing member 11(2D). For example, Kapton® double-sided thin polyimide tape is one kind of the forgoing double-sided tape with low thermal conductivity property.

Figure 12A:
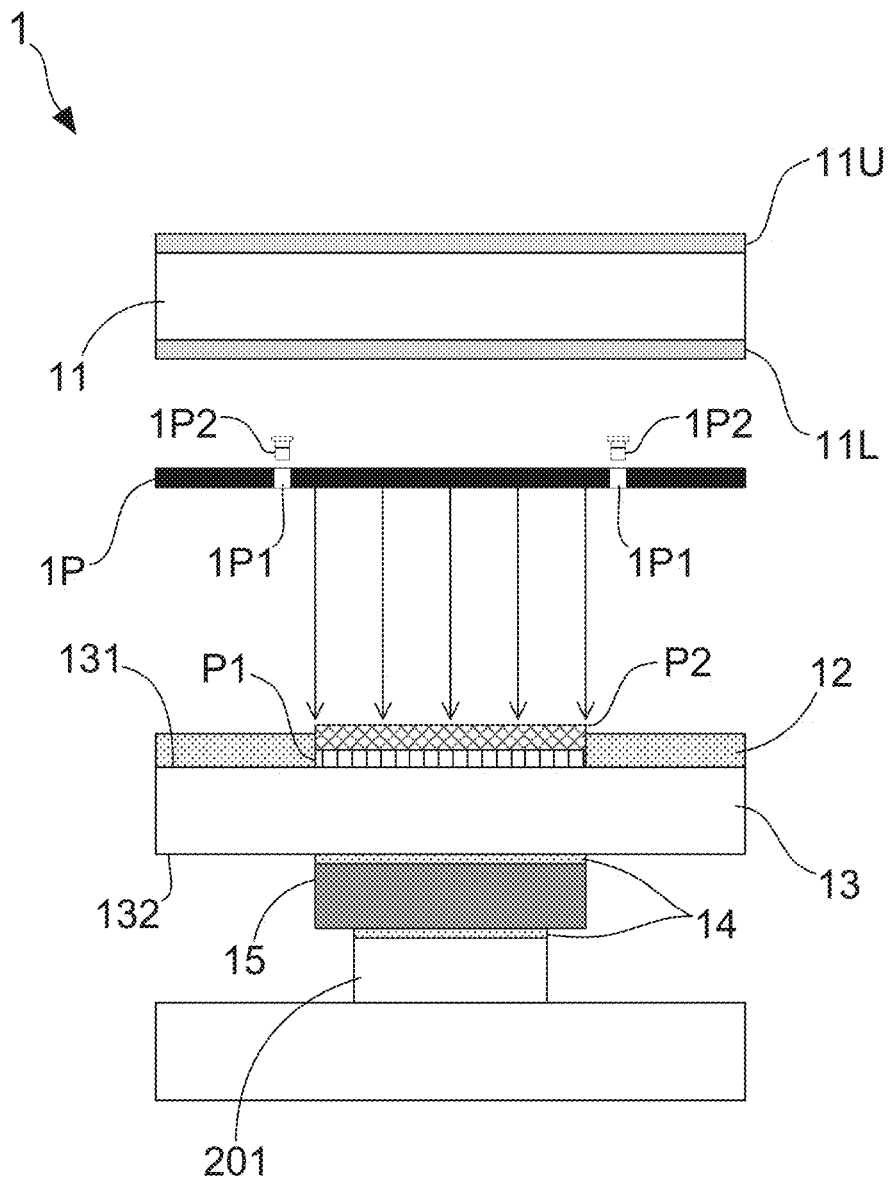
FIG. 12A shows a schematic cross-sectional view of the casing structure with functionality of effective thermal management according to the present invention.
Figure 12B:
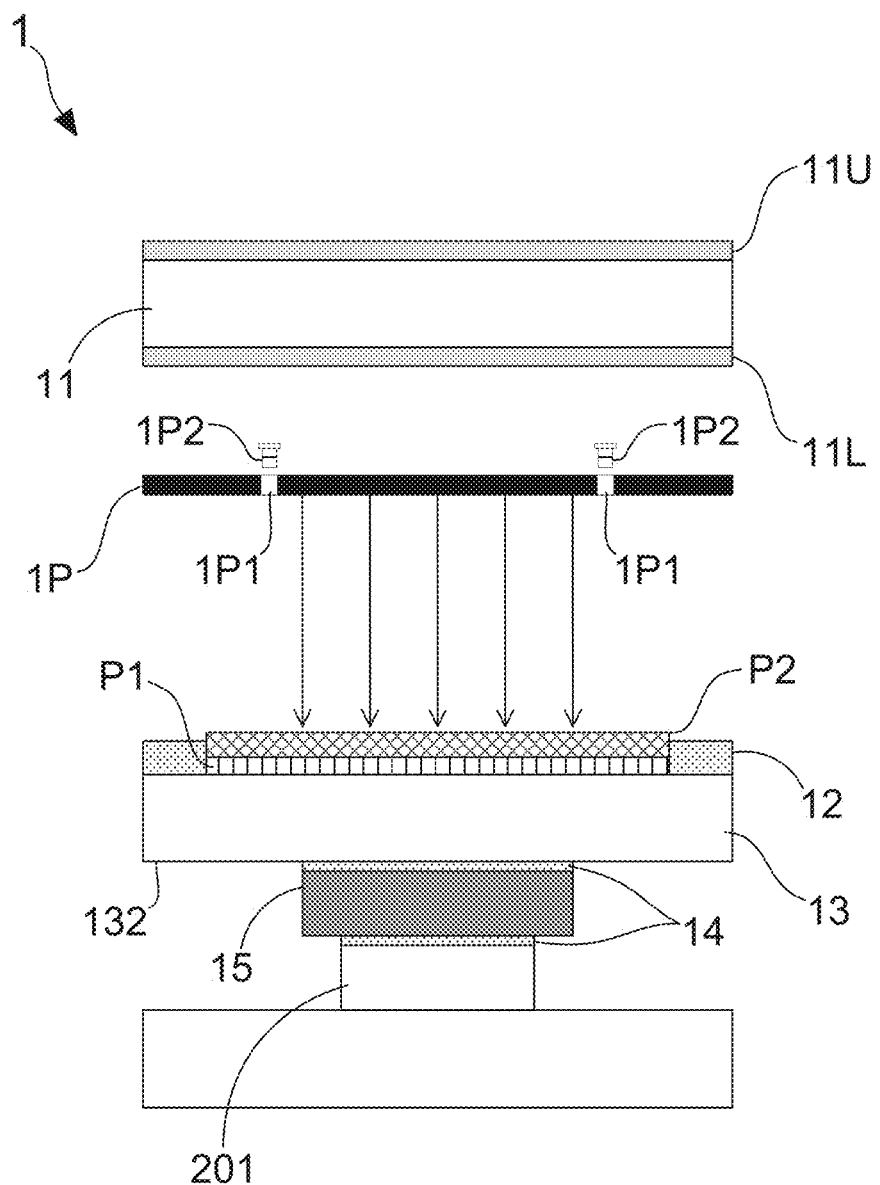
FIG. 12B shows a schematic cross-sectional view of the casing structure with functionality of effective thermal management according to the present invention.

FIG. 12A and FIG. 12B both show a schematic cross-sectional view of the casing structure with functionality of effective thermal management according to the present invention. In a practicable embodiment, the casing structure 1 of the present invention further comprises a flat plate 1P with at least one drilling screw 1P2, and the flat plate 1P is disposed between the low thermal conductivity medium 12 and the casing member 11. As FIG. 12A shows, the flat plate 1P is located on the elastic pressing unit (p1, p2), and is provided with at least one screw holes 1P1 for receiving the at least one drilling screw 1P2, respectively. As such, it is able to make the elastic pressing unit (p1, p2) be tightly fixed with the low thermal conductivity medium 12 and the second heat spreader 13 by adjusting a drilling depth of the drilling screw 1P2.

As described in more detailed below, as FIG. 12B shows, the drilling screw 1P2 applies a compressive stress to the elastic pressing unit (p1, p2), and a unit compressive stress of the elastic pressing unit (p1, p2) and the second spreader 13 can be adjustable by correspondingly changing an area size of the elastic pressing unit (p1, p2).

Third Embodiment

Figure 13:
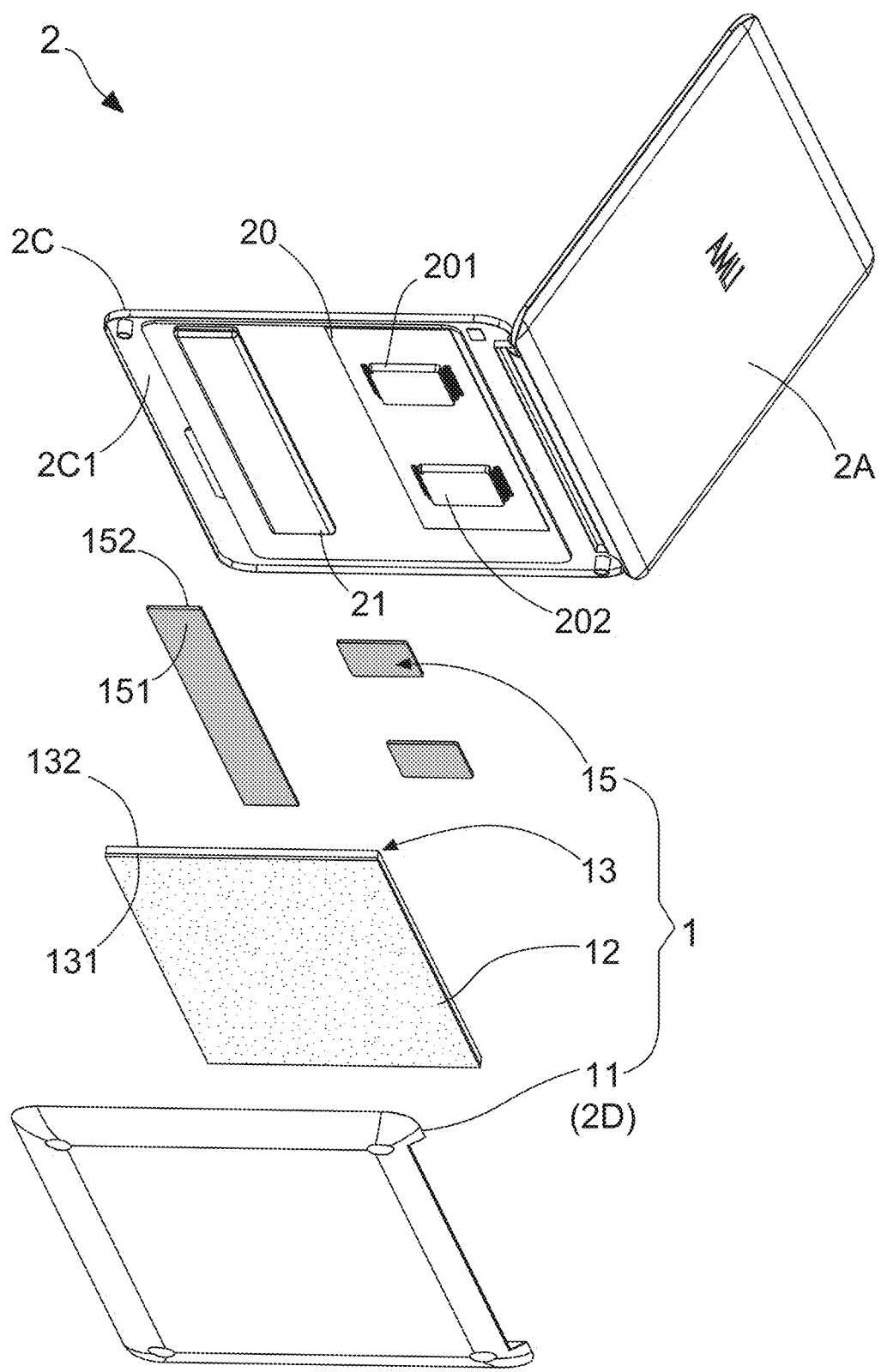
FIG. 13 shows one perspective stereo diagram of an electronic device having a casing structure with functionality of effective thermal management according to the present invention.
Figure 14:
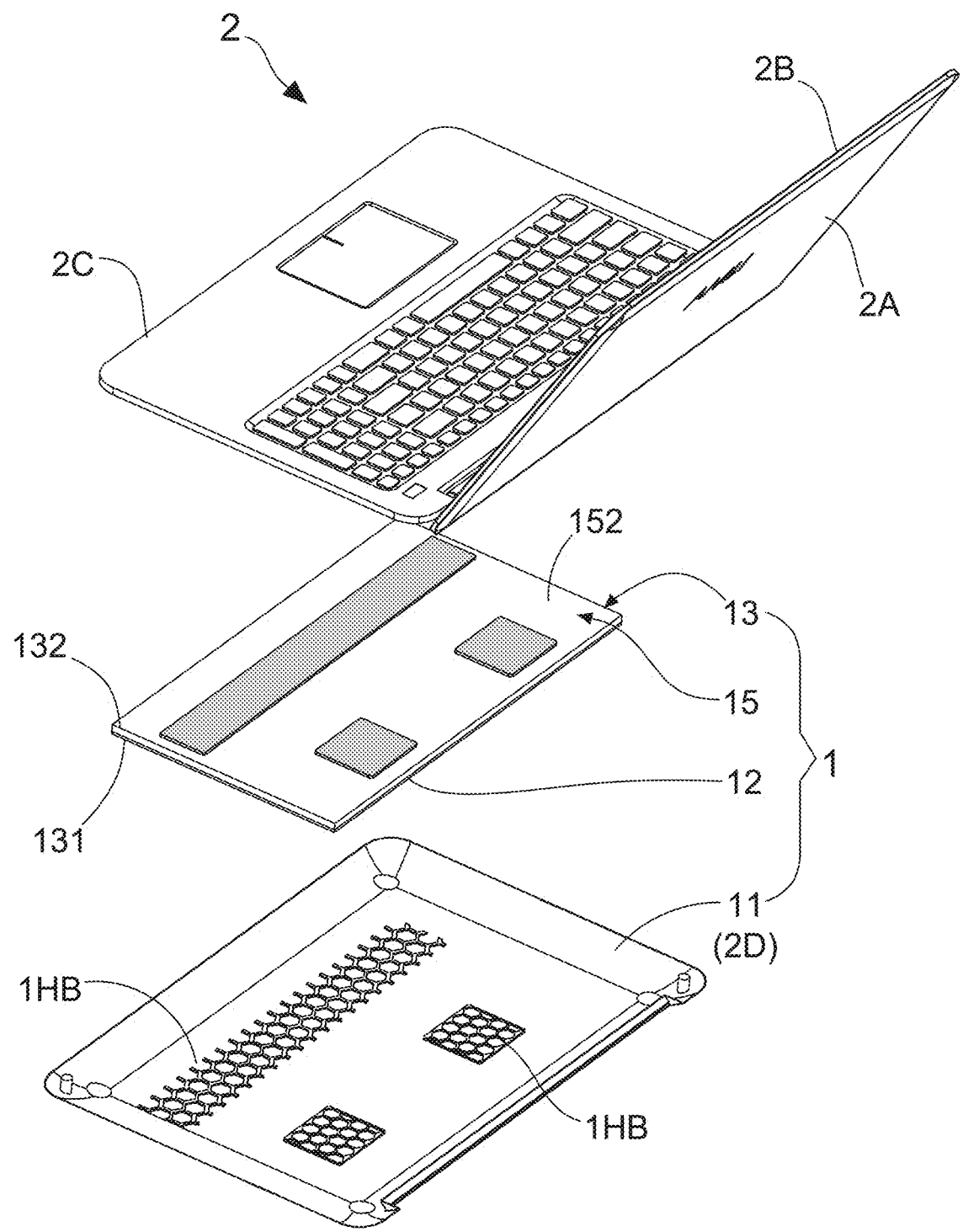
FIG. 14 shows another one perspective stereo diagram of the electronic device having the casing structure with functionality of effective thermal management according to the present invention.

FIG. 13 shows one perspective stereo diagram of an electronic device that having a casing structure with functionality of effective thermal management according to the present invention, and FIG. 14 illustrates another one perspective stereo diagram of the electronic device that having the casing structure with functionality of effective thermal management according to the present invention. The present invention discloses a casing structure 1 with functionality of effective thermal management for being applied in an electronic device 2 by a form of a top casing and/or a back casing. For example, FIG. 13 and FIG. 14 depict that the electronic device 2 is a laptop computer comprising a first casing of a display device and a second casing of a host device. In which, the first casing consists of a rear cover 2A and a front panel 2B, and the second casing consists of a base cover 2D and a top cover 2C. From FIG. 13 and FIG. 14, it is found that a lithium battery 21 and a main board 20 provided with a CPU 201 and a GPU 202 are disposed in an accommodation space 2C1 of the top cover 2C. Engineers skilled in development and manufacture of the laptop computer certainly know that, the lithium battery 21, the CPU 201, and the GPU 202 are the principal heat source in the laptop computer.

In third embodiment, the casing structure 1 of the present invention comprises a casing member 11 made of a metal material, a low thermal conductivity medium 12, a second heat spreader 13, a plurality of first heat spreaders 15, and a honeycomb structure 11HB with a plurality of pores. The low thermal conductivity medium 12 is connected to an inner surface of the casing member 11, and the second heat spreader 13 is connected to the low thermal conductivity medium 12 by a first surface 131 thereof. On the other hand, the first heat spreader 15 can be a semiconductor substrate, graphite sheet, a sheet-metal radiator, or a sheet-ceramic radiator, and is connected to a second surface 131 of the second heat spreader 13 by a first surface 151 thereof. Moreover, the first heat spreaders 15 are connected to a hard disk drive (not shown), the lithium battery 21, the CPU 201 and the GPU 202 (i.e., the heat source) of the electronic device 2 by a second surface 152 thereof.

From FIG. 13 and FIG. 14, it can find that the casing member 11 is the base cover 2D of the laptop computer (i.e., the electronic device 2). In first embodiment, the casing member 11(2D) is made of a metal material such as magnesium (Mg) alloy, aluminum (Al) alloy, iron (Fe) alloy, titanium (Ti) alloy, or others metallic alloys. However, in other practicable embodiment, the casing member 11(2D) can also be made of a non-metal material like plastic, carbon fiber or glass.

FIG. 5 shows a curve plot of temperature versus emission power of various metal materials. It is worth further explaining that, Mg—Li alloy is composed of Mg-xLi, and is a lightweight alloy because of having a density that is less than 1.6 g/cm³. As described in more detail below, (Mg-12 wt % Li)LZ12 is one kind of Mg—Li alloy, and comprises: principal element Mg, Li of 12 wt % and at least one minor element like Zn, Al, Y, and/or Mn. Moreover, (Mg-12 wt % Li-1 wt % Zn)LZ121 is also one kind of Mg—Li alloy, and comprises: principal element Mg, Li of 12 wt %, Zn of 1 wt %, and at least one minor element. On the other hand, (Mg-9 wt % Li-3 wt % Al-3 wt % Zn)LAZ933 is one kind of Mg—Li—Al alloy, and comprises: principal element Mg, Li of 9 wt %, Al of 3 wt %, Zn of 3 wt %, and at least one minor element. From data of FIG. 5, it is understood that, LAZ (Mg—Li—Al) alloys exhibit the best thermal radiation ability, and the LZ (Mg—Li) alloys perform the next best thermal radiation ability.

Figure 15:
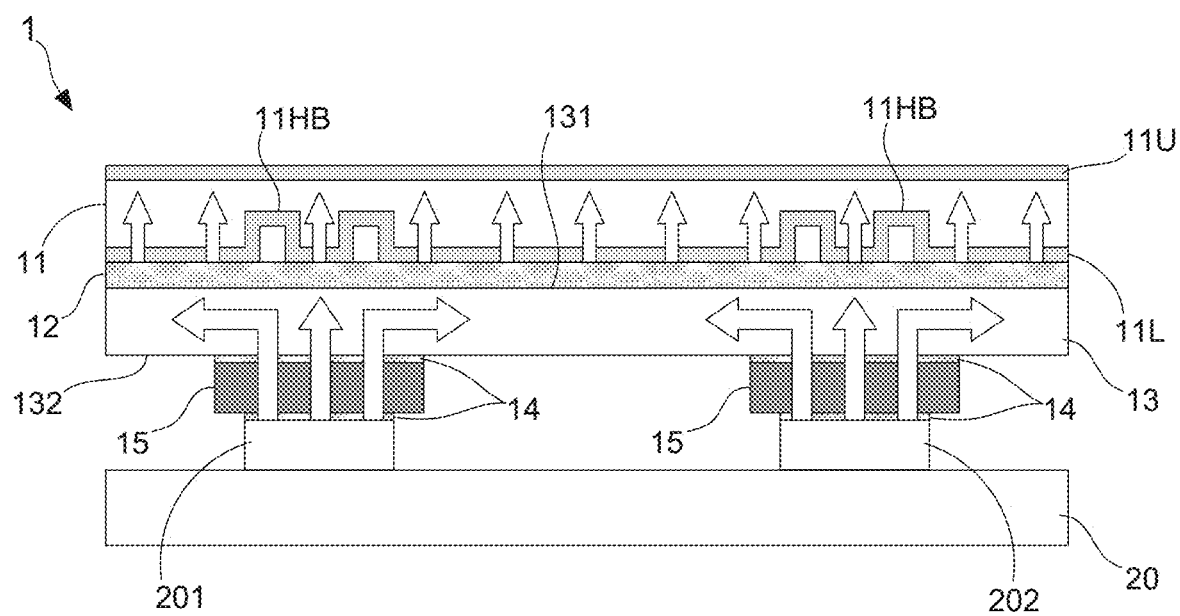
FIG. 15 shows a schematic exploded diagram of the casing structure with functionality of effective thermal management according to the present invention.

Referring to FIG. 13 and FIG. 14 again, and please refer to FIG. 15 showing a schematic cross-sectional view of the casing structure 1. In the present invention, a medium member that has a thermal conductivity less than or equal to 0.2 W/m·K is adopted for being as the low thermal conductivity medium 12. For example, pressure sensitive adhesive (PSA), aerogel, Kapton®, polyimide adhesive tape, or Nano silica balloon insulator sheet (NASBIS). On the other hand, in a practicable embodiment, the second heat spreader 13 can be a vapor chamber (VC), a metal thermal ground plane (TGP) and a polymer TGP. Engineers skilled in development and research of thermal solution should know that, since a fluid transportation inside the vapor chamber is two dimensional, the vapor chamber has a two-dimensional thermal conduction characteristic. Moreover, the casing member 11(2D) is formed with a first surface treatment coating 11L on the inner surface thereon, and is also formed with a second surface treatment coating 11U on an outer surface thereon. In a practicable embodiment, the first surface treatment coating 11L and the second surface treatment coating 11U can both be selected from the group consisting of anodizing treatment and ceramic coating.

As FIG. 13, FIG. 14, and FIG. 15 show, in case of the laptop computer being normal operated by a user, heat generated from the heat source including hard disk drive, lithium battery 21, the CPU 201, and the GPU 202 is thermally transferred to the second surface 132 of the second heat spreader 13 through the first heat spreader 15, and then is two-dimensionally spread in the second heat spreader 13 so as to be further uniformly transferred to the first surface 131 of the second heat spreader 13. According to the present invention, the low thermal conductivity medium 12 and the low thermal conductivity member P1 are adopted for controlling heat transfer of heat transferring paths from the second heat spreader 13 and heat source to the casing member 11(2D), so as to well controlled an outer surface temperature of the casing member 11(2D) during the heat being dissipated into air by the outer surface of the casing member 11(2D).

Please refer to FIG. 13, FIG. 14, and FIG. 15 again. In the present invention, the low thermal conductivity medium 12 is adopted for reducing a heat transfer rate of a heat transferring path that starts from the second heat spreader 13 and ends at the casing member 11(2D), so as to well controlled an outer surface temperature of the casing member 11(2D) during the heat being dissipated into air. However, use of the low thermal conductivity medium 12 may lead a first junction temperature measured at a first junction between the first surface 151 of the first heat spreader 15 and the second surface 132 of the second heat spreader 13 as well as a second junction temperature measured at a second junction between the heat source and the second surface of the first heat spreader 15 to rise. Therefore, when applying the casing structure 1 of the present invention in an electronic device 2, it needs to simultaneously concern that the CPU 201 and the GPU 202 working in high operating load would generate high temperature so as to cause a thermal mismatch occur between the heat source, the first heat spreader 15 and the second heat spreader 13.

For preventing occurrence of the thermal mismatch, as FIG. 10 and FIG. 11 show, a thermal interface material 14 is disposed between the heat source and the first heat spreader 15, and the thermal interface material 14 is also disposed between the first heat spreader 15 and the second heat spreader 13. In one practicable embodiment, the thermal interface material 14 is thermal grease, which not only provides an adhesive force between the heat source and the first heat spreader 15 as well as between the first heat spreader 15 and the second heat spreader 13, but also prevent the thermal mismatch occurring between the heat source, the first heat spreader 15 and the second heat spreader 13. Of course, the thermal interface material 14 is not limited to be thermal grease, which can be any other thermally conductive materials.

In third embodiment, there is a honeycomb structure 11HB with a plurality of pores formed on an inner surface of the casing member 11(2D), and the honeycomb structure 11HB is located between the low thermal conductivity medium 12 and the casing member 11(2D). By such arrangement, after the low thermal conductivity medium 12 is connected to the inner surface of the casing member 11(2D), the plurality of pores of the honeycomb structure 11HB become a plurality of are gaps between the casing member 11(2D) and the low thermal conductivity medium 12. It is worth noting that, the honeycomb structure 11HB is correspondingly opposite to the heat sources (i.e., hard disk drive, lithium battery 21, CPU 201, and GPU 202) under the isolation of the low thermal conductivity medium 12, the second heat spreader 13 and the plurality of first heat spreaders 15. As such, the use of the honeycomb structure 11HB is helpful in adjusting the connection tightness between the low thermal conductivity medium 12 and the second heat spreader 13, the second heat spreader 13 and the first heat spreader 15, and/or the first heat spreader 15 and the heat source. Moreover, the air gaps formed between the low thermal conductivity medium 12 and the casing member 11(2D) cab be helpful to control the surface temperature of the casing member 11(2D).

In a partible embodiment, the elastic pressing unit that comprises a low thermal conductivity member P1 and an elastic member P2 shown in FIG. 11 can also be added into the third embodiment. The low thermal conductivity member P1 contacts the second heat spreader 13 and is embedded in the low thermal conductivity medium 12, such that the low thermal conductivity medium 12 and the low thermal conductivity member P1 are able to control heat transfer of heat transferring paths. Moreover, the elastic member P2 is disposed on the low thermal conductivity member P1 for applying an elastic force to the low thermal conductivity member P1 and the low thermal conductivity medium 12, so as to make the low thermal conductivity medium 12 be tightly attached onto an inner surface of the casing member 11(2D). The low thermal conductivity member P1 can be an aerogel or an air gap. Moreover, taking spring sheet as the elastic member P2 is helpful in not only adjusting the connection tightness between the second heat spreader 13 and the first heat spreader 15 as well as between the first heat spreader 15 and the heat source, but also preventing the occurrence of thermal mismatch.

Furthermore, at least one fastening member can be used in the casing structure 1 of the present invention, so as to tightly fix the second heat spreader 13 and the low thermal conductivity medium 12 onto the inner surface of the casing member 11(2D). Moreover, by the use of the fastening member, connection tightness between the heat source and the first heat spreader 15, the first heat spreader 15 and the second heat spreader 13, and/or the second heat spreader 13 and the low thermal conductivity medium 12 can be properly adjusted for preventing occurrence of thermal mismatch. The said fastening member can be a drilling screw, a snapping member or an embedded mechanism. Herein, it is worth further explaining that, taking a double-sided tape made of a low thermal conductivity material as the low thermal conductivity medium 12 is helpful in adjusting the connection tightness between the second heat spreader 13 and the low thermal conductivity medium 12 as well as between the low thermal conductivity medium 12 and the casing member 11(2D). For example, Kapton® double-sided thin polyimide tape is one kind of the forgoing double-sided tape with low thermal conductivity property.

Therefore, through above descriptions, all embodiments and their constituting elements of the casing structure with functionality of effective thermal management proposed by the present invention have been introduced completely and clearly. The above description is made on embodiments of the present invention. However, the embodiments are not intended to limit scope of the present invention, and all equivalent implementations or alterations within the spirit of the present invention still fall within the scope of the present invention.

What is claimed is:

1. A casing structure with functionality of effective thermal management, being applied in an electronic device for achieving a heat dissipation of a heat source, and comprising:
   at least one thermal conductive member, being disposed on the heat source, and being selected from a group consisting of graphite sheet, sheet-metal radiator and sheet-ceramic radiator;
   a heat spreader, being disposed on the thermal conductive member, and being a thermal ground plane (TGP);
   a low thermal conductivity medium, being disposed on the heat spreader, and having a thermal conductivity that is less than 0.2 W/m·K;

a casing member, being made of a material selected from a group consisting of Mg—Li alloy, Mg—Li—Al alloy, Mg—Al alloy, Mg—Mn alloy, and Mg—Zr alloy, and being disposed on the low thermal conductivity medium, such that the heat thermally transferred from the low thermal conductivity medium to the casing member is consequently dissipated away from the casing member to air; and a surface treatment coating, being deposited on an inner surface and/or an outer surface of the casing member, and being selected from a group consisting of anodizing treatment coating and ceramic coating;

wherein in case of the heat source generating a heat, the thermal conductive member transfers the heat to the heat spreader, and then the heat spreader two-dimensionally spreads the heat;

wherein the low thermal conductivity medium with the thermal conductivity of less than 0.2 W/m·K transfers the heat from a surface of the heat spreader to the casing member, so as to well control an outer surface temperature of the casing member during the heat being dissipated into air.

2. The casing structure of claim 1, wherein the low thermal conductivity medium is selected from a group consisting of pressure sensitive adhesive (PSA), aerogel, Kapton®, polyimide adhesive tape, Nano silica balloon insulator sheet (NASBIS).

3. The casing structure of claim 1, wherein there is a first thermal interface material disposed between the heat source and the thermal conductive member, and a second thermal interface material being disposed between the thermal conductive member and the heat spreader.

* * * * *